United States Patent
Spidsbjerg et al.

(10) Patent No.: US 10,003,897 B2
(45) Date of Patent: Jun. 19, 2018

(54) HEARING DEVICE INTERFACE

(71) Applicant: Oticon A/S, Smørum (DK)

(72) Inventors: Brian Spidsbjerg, Smørum (DK);
Michael Frank Petersen, Smørum (DK); Lars Monroy, Kongens Lyngby (DK); Lars Persson, Smørum (DK); Troels Holm Pedersen, Smørum (DK)

(73) Assignee: OTICON A/S, Smørum (DK)

( * ) Notice: Subject to any disclaimer, the term of this patent is extended or adjusted under 35 U.S.C. 154(b) by 0 days. days.

(21) Appl. No.: 15/244,680

(22) Filed: Aug. 23, 2016

(65) Prior Publication Data

US 2017/0064468 A1 Mar. 2, 2017

(30) Foreign Application Priority Data

Aug. 24, 2015 (EP) .................................... 15182199

(51) Int. Cl.
*H04R 25/00* (2006.01)
*H05K 5/00* (2006.01)
*H05K 5/03* (2006.01)

(52) U.S. Cl.
CPC .......... *H04R 25/556* (2013.01); *H04R 25/65* (2013.01); *H05K 5/0091* (2013.01); *H05K 5/03* (2013.01); *H04R 25/70* (2013.01); *H04R 2420/09* (2013.01)

(58) Field of Classification Search
CPC combination set(s) only.
See application file for complete search history.

(56) References Cited

U.S. PATENT DOCUMENTS

| 6,044,164 | A * | 3/2000 | Ach-Kowalewski ............ H04R 25/505 381/312 |
| 8,923,537 | B2 * | 12/2014 | Tipsmark ............. H04R 25/556 381/314 |
| 2009/0042426 | A1 * | 2/2009 | Kramer .................. H04R 25/65 439/188 |
| 2010/0272272 | A1 | 10/2010 | Muller et al. |
| 2012/0014549 | A1 | 1/2012 | Higgins et al. |
| 2012/0202371 | A1 | 8/2012 | Portmann et al. |

OTHER PUBLICATIONS

Islam et al., "8 Pin RIC Socket for Hearing Aid Applications," Proceedings of the 9th International Conference on Multi-Material Micro Manufacture, Jan. 1, 2012, pp. 241-249, XP055338419.
Phoenix Contact SAS, "Pluscon circular—Circular connectors in M5, M8, and M12", Dec. 31, 2013, pp. 1-44. (URL:https://www.phoenixcontact.com/assets/downloads_ed/local_fr/web_dwl_promotion/52003595.Pluscon_Circular_SACC.44_pages_EN.pdf).
Tyco Electronics, "Pin and Socket Connectors", Catalog 1308940, May 31, 2003, pp. 1-219. (URL:http//www.farnell.com/datasheets/314442.pdf).

* cited by examiner

*Primary Examiner* — Amir Etesam
(74) *Attorney, Agent, or Firm* — Birch, Stewart, Kolasch & Birch, LLP

(57) ABSTRACT

A hearing device interface for a wired connection between a hearing device and an external device is disclosed. In particular an interface for a hearing aid. The interface comprises a first group of electrically conducting contact pins extending parallel to each other and being configured to engage with a corresponding plug of the external device provided with plug slots, wherein the interface further comprises a second electrically conducting contact pin extending parallel to the first group of electrically conducting contact pins.

26 Claims, 4 Drawing Sheets

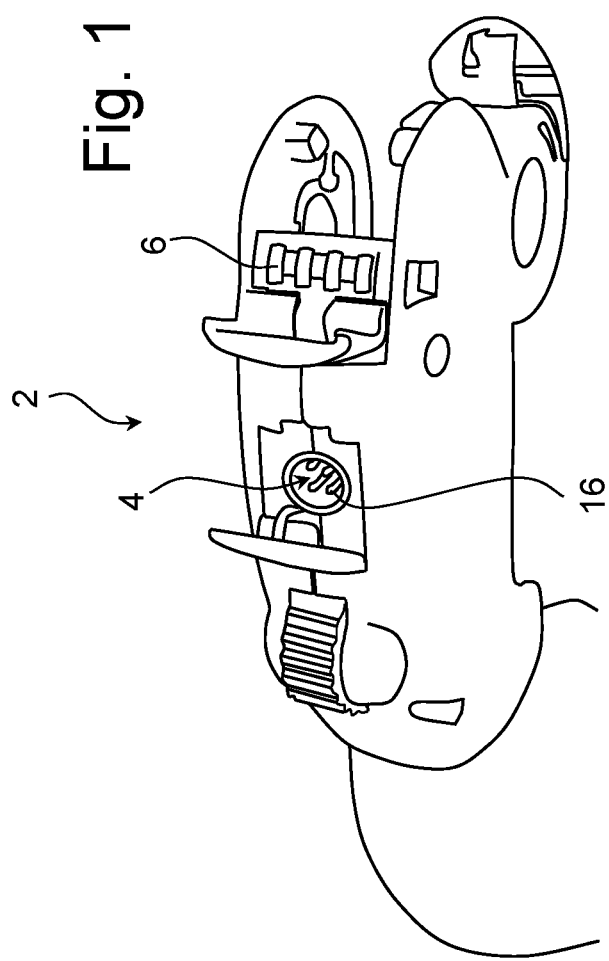
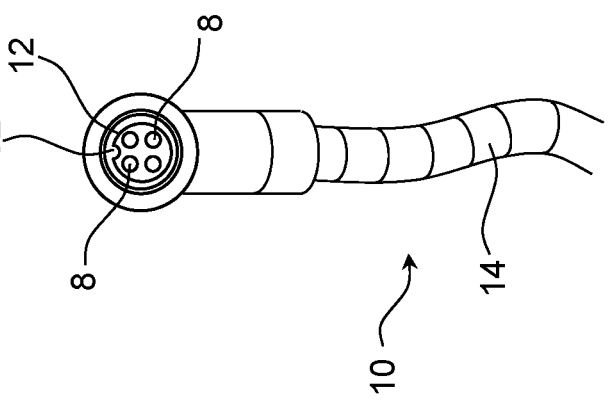
Fig. 1B
Fig. 1A
Prior Art

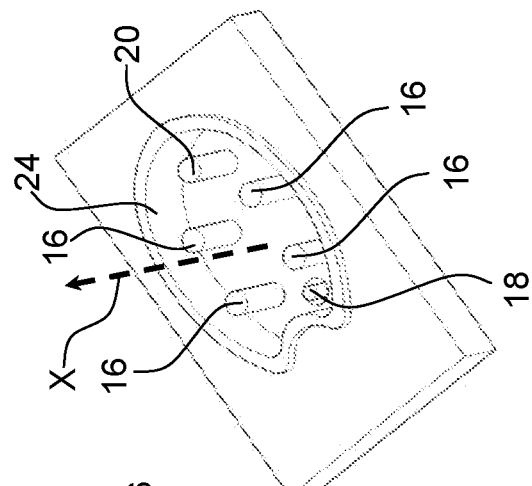
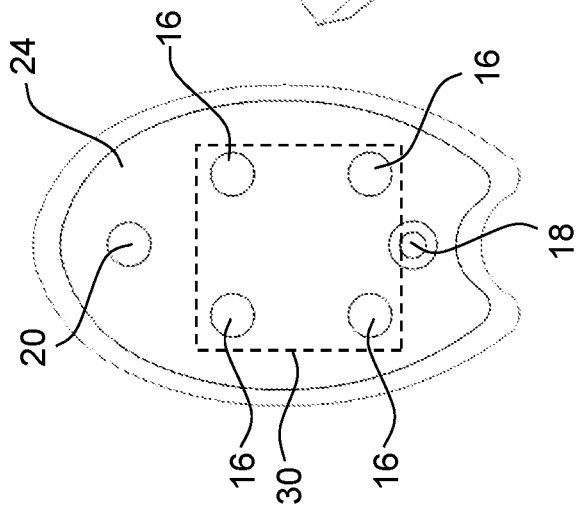
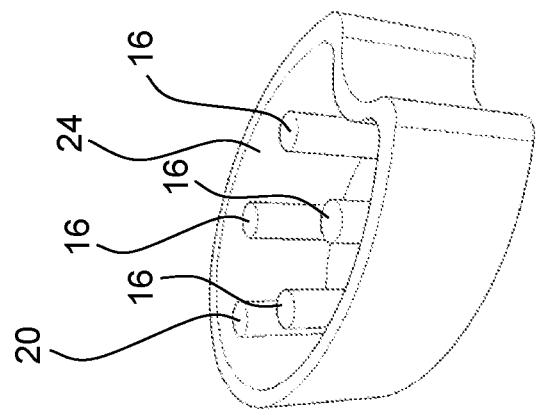

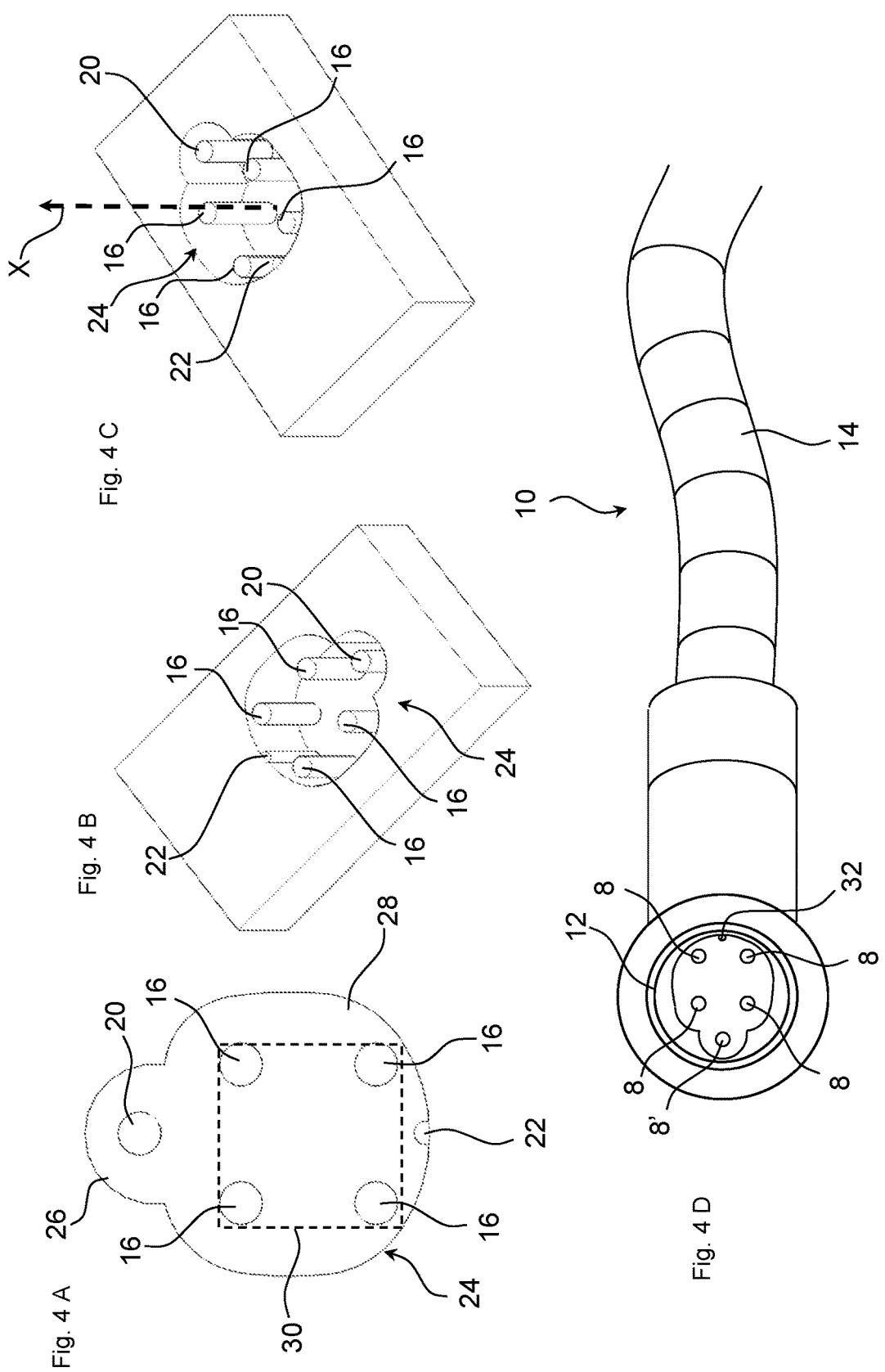

HEARING DEVICE INTERFACE

FIELD OF DISCLOSURE

The present disclosure relates to a hearing device interface for a wired connection between a hearing device and an external device. More particularly, the present disclosure relates to a hearing device interface that can be used as both programming interface and as accessory connection.

BACKGROUND

Today, the typical hearing device contains an interface connector for programming. Such interface connector could be a "standard connector" e.g. in the form of a CS44 connector. On the other hand, for hearing devices that are required to support accessories such as e.g. direct audio input (DAI) and frequency modulation (FM), a separate connection interface is utilized.

As the trend goes towards smaller hearing devices, it would be desirable to be capable of reducing the physical extension of the connection interfaces in order to allow for smaller hearing devices to be provided.

SUMMARY

Preferred embodiments of the present disclosure can be achieved by a hearing device interface as defined in claim 1 and by a hearing device as defined in claim 14. Other preferred embodiments are defined in the dependent sub claims, explained in the following description and illustrated in the accompanying drawings.

The hearing device interface is a hearing device interface for a wired connection between a hearing device and e.g. an external device, which interface comprises a first group of electrically conducting contact pins extending parallel to each other and being configured to engage with a corresponding plug of the external device provided with plug slots, wherein the interface further comprises a second electrically conducting contact pin extending parallel to the first group of electrically conducting contact pins. The external device may be any suitable electrical device that can be electrically connected to the hearing device.

Hereby, it is possible to combine several connection interfaces in one interface. Accordingly, space can be saved and a smaller hearing device may be provided.

The interface comprises a first group of electrically conducting contact pins extending parallel to each other and being configured to engage with a corresponding plug of the external device provided with plug slots.

The electrically conducting contact pins may have any suitable length and cross-sectional geometry. Moreover, they may be produced in any suitable material.

The first group of electrically conducting contact pins may comprise 4, 5, 6, 7, or 8 electrically conducting contact pins. Other numbers may be envisioned.

The first group of contact pins may be arranged to constitute a square formation. Hereby, it is possible to apply the first group of contact pins in standard configuration including standard connections such as a standard connector. The first group may be constituted by four contact pins arranged so form a square, that is, one pin at respective corner of the square. The second pin may be placed outside of the square. The second pin may be at a distance from the first group of pins, e.g. have equal distances relative to two of the pins of the first group. The second pin may be placed between two pins of the first group in a direction perpendicular to a line connecting the two pins.

The hearing device interface may constitutes a programming interface and an accessory connection merged into one interface.

This configuration makes it possible to provide a programming interface and an accessory connection in a space saving manner.

Three of the first group of electrically conducting contact pins may be used for both the programming interface and for the accessory connection. Hereby, a compact connection can be provided.

At least some of the electrically conducting contact pins may have the same height. Hereby the connection interface may be applied as a standard connection for a standard-compliant plug. One or a few of the pins may be longer, these could be used for ESD protection. The same height pins may be arranged so as to define a common plane at the tips of the pins. This could be four pins of a first group arranged in a square and a second pin arranged outside the square, where the tip of each of the five pins are in the same plane.

The electrically conducting contact pins may have the same geometry, preferably a basically cylindrical geometry. By applying the same geometry, preferably a basically cylindrical geometry, an easier engagement between the contact pins and the corresponding slots can be achieved. Moreover, a basically cylindrical geometry is less sensitive to minor irregularities in the geometry of the slots.

The first group of contact pins may be adapted to engage with a standard connector plug. This is an advantage since e.g. the CS44 standard connector plug is widely used to establish connection to a hearing device, in particular to a hearing aid.

The hearing device interface may comprises a guide member adapted to engage with a corresponding guide member in the corresponding plug. Hereby, it is possible to guide the insertion of the plug into the interface socket. Furthermore, the guide members can support the plug and hereby reduce the mechanical stress induced during the insertion process.

The guide member may be provided in the opposite end of the hearing device interface than the second contact pin. This position may facilitate an easier insertion of the plug into the interface socket.

The hearing device interface may comprises a first portion formed as a portion of a cylindrical bore. Hereby the insertion of a plug may be eased since the interface socket will be less sensitive to irregularities in plug periphery or in the periphery of the interface socket.

The second electrically conducting contact pin may be arranged centrally in the first portion. Hereby, the electrically conducting contact pin is positioned in the largest possible distance from the periphery of the first portion. Accordingly, damage of the electrically conducting contact pin e.g. due to bending, can be prevented.

The hearing device interface may comprises a second portion basically formed as a cylindrical bore. Hereby, the insertion of the plug into the interface socket can be eased.

BRIEF DESCRIPTION OF THE DRAWINGS

The aspects of the disclosure may be best understood from the following detailed description taken in conjunction with the accompanying figures. The figures are schematic and simplified for clarity, and they just show details to improve the understanding of the claims, while other details are left out. Throughout, the same reference numerals are used for identical or corresponding parts. The individual features of each aspect may each be combined with any or all features of the other aspects. These and other aspects, features and/or technical effects will be apparent from and elucidated with reference to the illustrations described hereinafter in which:

FIG. 1 A shows a cable unit with a standard connector plug;

FIG. 1 B shows a schematic perspective view of a hearing device provided with an interface socket and an accessory interface;

FIG. 2 B shows a close-up view of the interface socket illustrated in FIG. 2 A;

FIG. 3 A shows a schematic perspective view of an interface socket according to the disclosure;

FIG. 3 B shows a top view of the interface socket shown in FIG. 3 A;

FIG. 3 C shows a perspective top view of the interface socket shown in FIG. 3 A and FIG. 3 B;

FIG. 4 A shows a top view of an interface socket according to the disclosure;

FIG. 4 B shows a perspective top view of the interface socket shown in FIG. 4 A;

FIG. 4 C shows a perspective top view of the interface socket shown in FIG. 4 A and FIG. 4 D shows a perspective view of a plug configured to be connected to the interface socket shown in FIG. 4 A, FIG. 4 B and FIG. 4 C.

DETAILED DESCRIPTION

Figure 2:
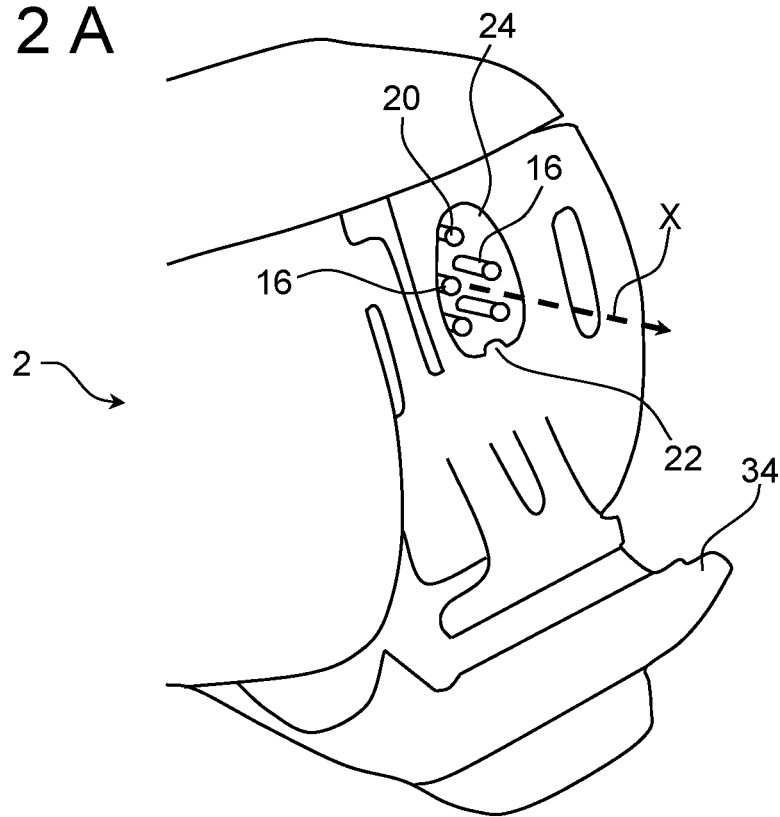
FIG. 2 A shows a schematic perspective view of a hearing device provided with an interface socket according to the disclosure.
Figure 2:
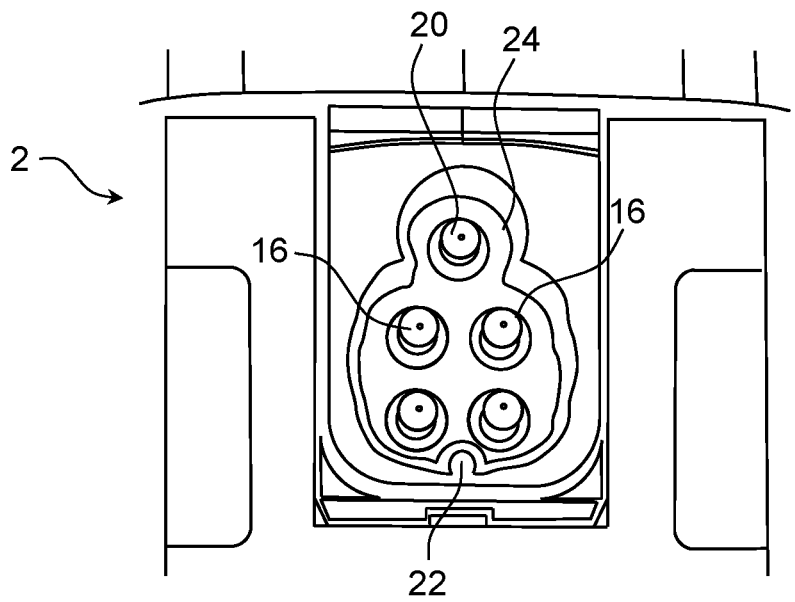

The detailed description set forth below in connection with the appended drawings is intended as a description of various configurations. The detailed description includes specific details for the purpose of providing a thorough understanding of various concepts. However, it will be apparent to those skilled in the art that these concepts may be practiced without these specific details. Several aspects of the apparatus are described by various blocks, functional units, modules, components, steps, processes etc. (collectively referred to as "elements"). Depending upon the particular application, design constraints or other reasons, these elements may be implemented using electronic hardware, computer programs, or any combination thereof.

A hearing device may be a hearing aid adapted to improve or augment a user's hearing capability by receiving an acoustic signal from a user's surroundings, generating a corresponding audio signal, possibly modifying the audio signal and providing the possibly modified audio signal as an audible signal to at least one of the user's ears. The "hearing device" may further refer to a device adapted to receive an audio signal electronically, possibly modifying the audio signal and providing the possibly modified audio signal as an audible signal to at least one of the user's ears. Such audible signals may be provided in the form of an acoustic signal radiated into the user's outer ear.

The hearing device is adapted to be worn in any known way. This may include i) arranging a unit of the hearing device behind the ear with a tube leading air-borne acoustic signals into the ear canal or with a receiver/loudspeaker arranged close to or in the ear canal such as in a behind-the-ear type hearing aid, and/or ii) arranging the hearing device entirely or partly in the pinna and/or in the ear canal of the user such as in an in-the-ear type hearing aid or in-the-canal/completely-in-canal type hearing aid, or iii) arranging a unit of the hearing device attached to a fixture implanted into the skull bone such as in bone-anchored hearing aids or cochlear implants, or iv) arranging a unit of the hearing device as an entirely or partly implanted unit such as in bone-anchored hearing aids or cochlear implant.

In general, a hearing device includes i) an input unit such as a microphone for receiving an acoustic signal from a user's surroundings and providing a corresponding input audio signal, and/or ii) a receiving unit for electronically receiving an input audio signal. The hearing device further includes a signal processing unit for processing the input audio signal and an output unit for providing an audible signal to the user in dependence on the processed audio signal.

The input unit may include multiple input microphones, e.g. for providing direction-dependent audio signal processing. Such a directional microphone system is adapted to enhance a target acoustic source among a multitude of acoustic sources in the user's environment. In one aspect, the directional system is adapted to detect (such as adaptively detect) from which direction a particular part of the microphone signal originates. This may be achieved by using conventionally known methods. The signal processing unit may include an amplifier that is adapted to apply a frequency dependent gain to the input audio signal. The signal processing unit may further be adapted to provide other relevant functionality such as compression, noise reduction, etc. The output unit may include an output transducer such as a loudspeaker/receiver for providing an air-borne acoustic signal transcutaneously or percutaneously to the skull bone or a vibrator for providing a structure-borne or liquid-borne acoustic signal. In some hearing devices, the output unit may include one or more output electrodes for providing the electric signals such as in a cochlear implant.

Referring now in detail to the drawings for the purpose of illustrating preferred embodiments of the disclosure, FIG. 2 A illustrates a schematic perspective view of a hearing device 2 provided with an interface socket 24 according to the disclosure. The hearing device 2 comprises a cover rotatably attached to the housing of the hearing device 2.

The interface socket 24 is configured to establish a wired connection between the hearing device 2 and an external device (not shown). The interface 24 comprises a first group of four electrically conducting contact pins 16 extending parallel to each other along a longitudinal axis X. The first group of four electrically conducting contact pins 16 are configured to engage with a corresponding plug of the external device provided with plug slots.

The interface 24 further comprises a second electrically conducting contact pin 20 extending parallel to the first group of four electrically conducting contact pins 16. The conducting contact pins 16, 20 have the same height and basically cylindrical geometry.

The hearing device interface 24 comprises a guide member 22 adapted to engage with a corresponding guide member in a corresponding plug. The guide member 22 is provided in the opposite end of the hearing device interface 24 than the second contact pin 20.

FIG. 2 B illustrates a close-up view of the interface socket 24 illustrated in FIG. 2 A. It can be seen that the interface socket 24 comprises a first group of electrically conducting contact pins 16 extending parallel to each other. The interface 24 further comprises a second electrically conducting contact pin 20 extending parallel to the first group of electrically conducting contact pins 16. The first group of electrically conducting contact pins 16 are provided in the lower section of the interface 24, whereas the second electrically conducting contact pin 20 is provided in the upper section of the interface 24.

A guide member 22 is provided in the opposite end of the hearing device interface 24 of the second contact pin 20. The guide member 22 extends parallel to the electrically conducting contact pins 16, 20.

FIG. 1 A illustrates a cable unit 10 with a standard connector plug 12. The plug 12 comprises four plug slots 8, provided in a square formation. A guide member 32 is provided in the top portion of the plug 12. The cable unit 10 comprises an electrical cable 14 electrically connected to the plug 12. The plug 12 is configured to be electrically connected to a corresponding interface socket 4 of the hearing device 2 shown in FIG. 1 B.

FIG. 1 B illustrates a schematic perspective view of a hearing device 2 provided with a interface socket 4 and an accessory interface 6. The interface socket 4 comprises four electrically conducting contact pins 16 extending parallel to each other. The accessory interface 6 comprises electrically conducting contact members extending parallel to each other.

The hearing device 2 comprises both a standard interface socket 4 and an additional accessory interface 6. Both structures take up space and consequently the minimum size of the hearing device 2 is restricted accordingly.

FIG. 3 A illustrates a schematic perspective view of an interface socket 24 according to the disclosure. The interface socket 24 may be integrated into a wall structure (of the housing) of a hearing device.

The interface socket 24 comprises a first group of four electrically conducting contact pins 16 extending parallel to each other and being configured to engage with a corresponding plug of an external device provided with plug slots. The interface 24 comprises a second electrically conducting contact pin 20 extending parallel to the first group of four electrically conducting contact pins 16. The second electrically conducting contact pin 20 is provided in a first end of the interface 24.

FIG. 3 B illustrates a top view of the interface socket 24 illustrated in FIG. 3 A. The interface socket 24 comprises a first group of four electrically conducting contact pins 16 arranged in a square formation 30. The four electrically conducting contact pins 16 extend parallel to each other and to a second electrically conducting contact pin 20.

The second electrically conducting contact pin 20 is provided in a first end of the interface 24, whereas a guide member 18 formed as a cylindrical positioning pin extending parallel to the pins 16, 20, is provided in the opposite end of the interface 24. The second electrically conducting contact pin 20 is arranged outside the square formed by the first group of four electrically conductive contact pins 16. In an alternative the second pin 20 could be arranged inside the square formed by the four pins 16.

FIG. 3 C illustrates a perspective top view of the interface socket 24 shown in FIG. 3 A and FIG. 3 B. It can be seen that the interface socket 24 comprises a group of four electrically conducting contact pins 16 extending parallel to an axis X extending perpendicular to the bottom surface of the interface socket 24. The interface socket 24 comprises a second electrically conducting contact pin 20 provided in the opposite end of the interface 24 of the guide member 18.

FIG. 4 A illustrates a top view of an interface socket 24 according to the disclosure. The interface 24 comprises a group of four electrically conducting contact pins 16 extending parallel to each other and a second electrically conducting contact pin 20 extending parallel to the four electrically conducting contact pins 16.

The interface 24 comprises a first portion 26 formed as a portion of a cylindrical bore. The second electrically conducting contact pin 20 is arranged centrally in the first portion 26.

The interface 24 comprises a second portion 28 essentially formed as a cylindrical bore. Other geometries may be employed. The first group of contact pins 16 are arranged to constitute a square formation 30 indicated with a dotted square.

The interface 24 constitutes a programming interface and an accessory connection merged into one interface 24. Three of the first group of electrically conducting contact pins 16 are used for both the programming interface 4 and for the accessory connection.

The interface 24 comprises a guide member 22 adapted to engage with a corresponding guide member in a corresponding plug (guide member 32 shown in FIG. 1 A).

FIG. 4 B illustrates a perspective top view of the interface socket 24 shown in FIG. 4 A, and FIG. 4 B illustrates a perspective top view of the interface socket 24 shown in FIG. 4 A.

The electrically conducting contact pins 16, 20 have the same height and geometry. It can be seen that the electrically conducting contact pins 16, 20 have a cylindrical geometry.

Moreover, the first group of contact pins 16 is adapted to engage with a standard connector plug like the one shown in FIG. 1 A.

FIG. 4 D illustrates a perspective view of a cable unit 10 provided with a connector plug 12 configured to be connected to the interface socket 24 shown in FIG. 4 A, FIG. 4 B and FIG. 4 C.

The plug 12 comprises four plug slots 8, provided in a square formation, and a further plug slot 8' provided in the top portion of the plug 12. A guide member 32 is provided in the bottom portion of the plug 12. The cable unit 10 comprises an electrical cable 14 electrically connected to the plug 12. The plug 12 is configured to be electrically connected to a corresponding interface socket 24 of the hearing device 2 shown in FIG. 4 A, FIG. 4 B and FIG. 4 C.

When nouns are used in the singular form, they are also intended to include the corresponding plural forms (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element, but an intervening element may also be present, unless expressly stated otherwise. Furthermore, "connected" or "coupled" as used herein may include wirelessly connected or coupled. As used herein, the term "and/or" includes any and all combinations of one or more of the associated listed items. The steps of any disclosed method are not limited to the exact order stated herein, unless expressly stated otherwise.

It should be appreciated that reference throughout this specification to "one embodiment" or "an embodiment" or "an aspect" or features included as "may" means that a particular feature, structure or characteristic described in connection with the embodiment is included in at least one embodiment of the disclosure. Furthermore, the particular features, structures or characteristics may be combined as suitable in one or more embodiments of the disclosure. The previous description is provided to enable any person skilled in the art to practice the various aspects described herein. Various modifications to these aspects will be readily apparent to those skilled in the art, and the generic principles defined herein may be applied to other aspects.

The claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more.

Accordingly, the scope should be judged in terms of the claims that follow.

LIST OF REFERENCE NUMERALS

2 Hearing device
4 Interface (socket)
6 Accessory interface
8 Plug slot
8' Plug slot
10 Cable unit
12 Plug
14 Cable
16 Contact pin
18 Guide member (positioning pin)
20 Contact pin
22 Guide member
24 Interface (socket)
26 First portion
28 Second portion
30 Square formation
32 Guide member
34 Cover
X Axis

The invention claimed is:

1. A hearing aid having a housing including a hearing device interface for a wired connection between the hearing device and an external device, which hearing device interface comprises a first group of four electrically conducting contact pins extending parallel to each other and being configured to engage with a corresponding plug of the external device provided with plug slots, the first group of electrically conducting contact pins are arranged to constitute a square formation where one electrically conductive contact pin is arranged at a corner of the square, each of the first group of electrically conductive pins being part of a programming interface,
wherein the hearing device interface further comprises a second electrically conducting contact pin extending parallel to the first group of electrically conducting contact pins, the second electrically conducting pin being part of an accessory connection, and
wherein at least one and no more than three of the first group of electrically conducting pins are part of both the programming interface and the accessory connection.

2. The hearing aid according to claim 1, wherein the hearing device interface comprises a merging of both the programming interface and the accessory connection into one.

3. The hearing aid according to claim 1, wherein three of the first group of electrically conducting contact pins are part of both the programming interface and the accessory connection.

4. The hearing aid according to claim 1, wherein the electrically conducting contact pins have the same height.

5. The hearing aid according to claim 1, wherein the electrically conducting contact pins have the same geometry.

6. The hearing aid according to claim 1, wherein the second electrically conducting contact pin is arranged outside the square formation formed by the first group of electrically conducting contact pins.

7. The hearing aid according to claim 1, wherein the second electrically conducting contact pin is arranged inside the square formation formed by the first group of electrically conducting contact pins.

8. The hearing aid according to claim 1, wherein the first group of contact pins is adapted to engage with a standard CS44 connector plug.

9. The hearing aid according to claim 1, wherein the hearing device interface comprises a guide member adapted to engage with a corresponding guide member in the corresponding plug.

10. The hearing aid according to claim 9, wherein the guide member is provided in the opposite end or side of the hearing device interface than the second contact pin.

11. The hearing aid according to claim 1, wherein the hearing device interface comprises a first portion formed as a portion of a cylindrical bore.

12. The hearing aid according to claim 11, wherein the second electrically conducting contact pin is arranged centrally in the first portion.

13. The hearing aid according to claim 1, wherein the hearing device interface comprises a second portion basically formed as a cylindrical bore.

14. The hearing aid according to claim 1, wherein the hearing aid comprises a movably mounted cover adapted to cover the hearing device interface.

15. A hearing aid having a housing wherein a hearing device interface for a wired connection between the hearing device and an external device is arranged at an opening of the housing, the hearing device interface comprises a first group of electrically conducting contact pins and the first group of electrically conducting pins being configured to engage with plug slots of a corresponding first plug of the external device provided, the first group of electrically conducting contact pins arranged to constitute a square formation,
wherein the hearing device interface further comprises a second electrically conducting contact pin extending parallel to the first group of electrically conducting contact pins, the second electrically conducting contact pin configured to engage with a corresponding second plug of the external device provided,
wherein a subset of the first group of electrically conducting pins are configured to engage with both the first and second plugs, said subset comprising at least one but less than all of the first group of electrical conducting pins configured to engage with the plug slots of the first plug.

16. The hearing aid according to claim 15, wherein the first group of electrically conducting contact pins comprises 4, 5, 6, 7, or 8 electrically conducting contact pins.

17. The hearing aid according to claim 15, wherein the first group of contact pins is four contact pins that are arranged to constitute the square formation.

18. The hearing aid according to claim 15, wherein the hearing device interface constitutes part of a programming interface and an accessory connection merged into one interface.

19. The hearing aid according to claim 15, wherein three of the first group of electrically conducting contact pins are part of both the programming interface and the accessory connection.

20. The hearing aid according to claim 15, wherein the electrically conducting contact pins have the same height.

21. The hearing aid according to claim 15, wherein the second electrically conducting contact pin is arranged outside the square formation formed by the first group of electrically conducting contact pins.

22. The hearing aid according to claim 15, wherein the first group of contact pins is adapted to engage with a standard CS44 connector plug.

23. The hearing aid according to claim 15, wherein the hearing device interface comprises a guide member adapted to engage with a corresponding guide member in the corresponding plug and wherein the guide member is provided in the opposite end of the hearing device interface than the second contact pin.

24. A hearing aid according to claim 1, wherein the hearing aid comprises a movably mounted cover adapted to cover the hearing device interface when no external device is connected.

25. A hearing aid having a housing including a hearing device interface for a wired connection between the hearing device and an external device, which hearing device interface comprises a first group of four electrically conducting contact pins extending parallel to each other and being configured to engage with a corresponding plug of the external device provided with plug slots, the first group of electrically conducting contact pins are arranged to constitute a square formation where one electrically conductive contact pin is arranged at a corner of the square, each of the first group of electrically conductive pins being part of a programming interface, wherein the hearing device interface further comprises a second electrically conducting contact pin extending parallel to the first group of electrically conducting contact pins, the second electrically conducting pin being part of an accessory connection, wherein at least one and no more than three of the first group of electrically conducting pins are part of both the programming interface and the accessory connection, and wherein each of the first group of electrically conducting contact pins and the second electrically conducting contact pin has the same geometry, and said geometry is basically cylindrical.

26. A hearing aid having a housing wherein a hearing device interface for a wired connection between the hearing device and an external device is arranged at an opening of the housing, the hearing device interface comprises a first group of electrically conducting contact pins and the first group of electrically conducting pins being configured to engage with plug slots of a corresponding first plug of the external device provided, the first group of electrically conducting contact pins arranged to constitute a square formation, wherein the hearing device interface further comprises a second electrically conducting contact pin extending parallel to the first group of electrically conducting contact pins, the second electrically conducting contact pin configured to engage with a corresponding second plug of the external device provided, wherein a subset of the first group of electrically conducting pins are configured to engage with both the first and second plugs, said subset comprising at least one but less than all of the first group of electrical conducting pins configured to engage with the plug slots of the first plug, and wherein each of the first group of electrically conducting contact pins and the second electrically conducting contact pin has the same geometry, and said geometry is basically cylindrical.

\* \* \* \* \*